(12) United States Patent
Ming et al.

(10) Patent No.: US 11,145,561 B2
(45) Date of Patent: Oct. 12, 2021

(54) DISPLAY PANEL AND METHOD FOR MANUFACTURING SAME

(71) Applicant: Wuhan China Star Optoelectronics Semiconductor Display Technology Co., Ltd., Wuhan (CN)

(72) Inventors: Xing Ming, Wuhan (CN); Caiqin Chen, Wuhan (CN); Yiyi Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 43 days.

(21) Appl. No.: 16/644,511

(22) PCT Filed: Apr. 18, 2019

(86) PCT No.: PCT/CN2019/083143
§ 371 (c)(1),
(2) Date: Mar. 5, 2020

(87) PCT Pub. No.: WO2020/124897
PCT Pub. Date: Jun. 25, 2020

(65) Prior Publication Data
US 2021/0257267 A1    Aug. 19, 2021

(30) Foreign Application Priority Data
Dec. 18, 2018 (CN) .......................... 201811546661.9

(51) Int. Cl.
*H01L 27/12* (2006.01)
*H01L 21/66* (2006.01)

(52) U.S. Cl.
CPC .............. *H01L 22/34* (2013.01); *H01L 22/12* (2013.01); *H01L 27/124* (2013.01); *H01L 27/1259* (2013.01)

(58) Field of Classification Search
CPC ....... H01L 22/34; H01L 22/12; H01L 27/124; H01L 27/1259; H01L 22/32;
(Continued)

(56) References Cited

U.S. PATENT DOCUMENTS

2010/0127258 A1* 5/2010 Kang .................. G02F 1/13458
257/48
2016/0181345 A1 6/2016 Lee et al.
(Continued)

FOREIGN PATENT DOCUMENTS

CN   107112348   8/2017
CN   108122804   6/2018
(Continued)

*Primary Examiner* — Bo B Jang (57) ABSTRACT

The present disclosure provides a display panel and a method for manufacturing the same. The method includes providing a substrate including a display area and a non-display area. A chip on film (COF) and a testing structure are disposed in the non-display area. A testing circuit includes a signal trace including a non-metal trace and a metal trace connecting to each other. A cutting line is disposed on the signal trace. The method further includes testing the display area of the substrate by the testing structure, and removing a test pad.

19 Claims, 6 Drawing Sheets

(58) Field of Classification Search
CPC ...... H01L 2924/01079; H01L 2924/14; G01R 31/2884
USPC .............................. 257/48, E23.179, E21.521
See application file for complete search history.

(56) References Cited

U.S. PATENT DOCUMENTS

2016/0247436 A1\* 8/2016 Lee ..................... G09G 3/2003
2016/0379906 A1\* 12/2016 Kim ..................... G09G 3/3688
257/48
2019/0280074 A1 9/2019 Li

FOREIGN PATENT DOCUMENTS

CN 108400101 8/2018
JP 2015-172530 10/2015

\* cited by examiner

DISPLAY PANEL AND METHOD FOR MANUFACTURING SAME

RELATED APPLICATIONS

This application is a National Phase of PCT Patent Application No. PCT/CN2019/083143 having International filing date of Apr. 18, 2019, which claims the benefit of priority of Chinese Patent Application No. 201811546661.9 filed on Dec. 18, 2018. The contents of the above applications are all incorporated by reference as if fully set forth herein in their entirety.

FIELD AND BACKGROUND OF THE INVENTION

The present disclosure relates to a field of display technology, and more particularly, to a display panel and a method for manufacturing the same.

Current display panels include a display area and a non-display area. The display area includes an array of thin film transistors (TFTs), and a plurality of data lines and a plurality of gate lines spaced apart from each other and intersected with each other to form an array. The non-display area surrounds the display area, and includes an array testing circuit, a chip on film (COF), and a test pad configured for testing electrical characteristics of an array substrate.

Figure 1:
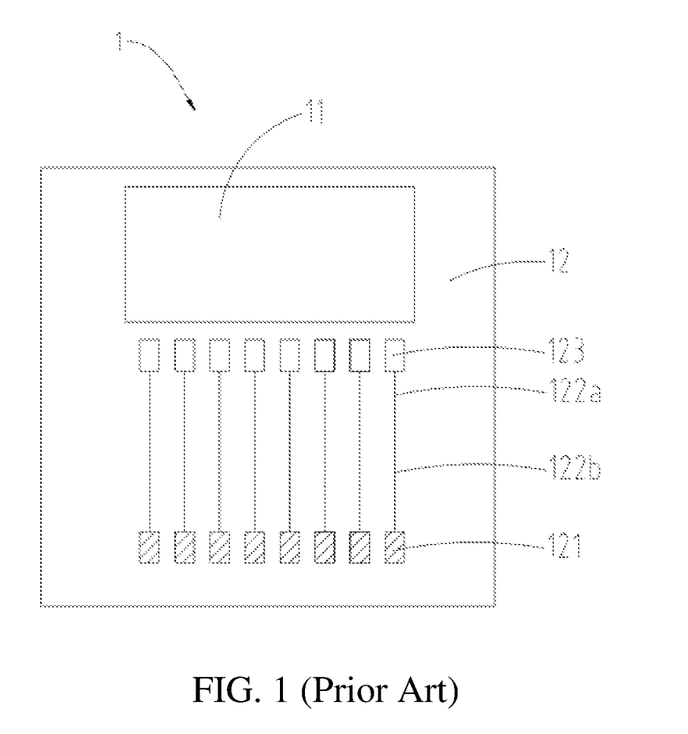
FIG. 1 is a schematic diagram showing a structure of a testing structure of a display panel according to prior art.

As shown in FIG. 1, during manufacturing of a display panel, it is required to form an array testing circuit on the display panel and to perform array testing for the display panel after formation of the array substrate 1 is finished. The array testing circuit is positioned between the test pad 121 and the COF 123. While testing for the array substrate 1 is executed, a test signal is inputted from the test pad 121, and is transmitted into the display area 11 via the testing circuit 122a and 122b to test the array substrate. After array testing is ultimately accomplished, control devices in the testing circuit are turned off. The test signal is provided by a flexible printed circuit (FPC) disposed on the COF 123. However, because of existence of the testing circuit 122a and 122b, the display panel has a complicated structure, and it is likely that electrostatic charge causes damage to the display panel. Even though the testing circuit 122a and 122b can be removed by cutting off, a portion of a metal trace is exposed and the exposed portion of the metal trace would be eroded.

Therefore, there is a need to provide a display panel and a method for manufacturing the same to solve the above-said problems.

SUMMARY OF THE INVENTION

The present disclosure provides a display panel and a method for manufacturing the same in order to solve the problems encountered by the prior art, where a portion of the metal trace is exposed and is eroded after the testing structure of the display panel is cut off, affecting quality of the display panel.

To solve the aforementioned problems, the present disclosure provides a method for manufacturing a display panel, comprising:

a step S10 of providing a substrate, wherein the substrate comprises a display area and a non-display area surrounding the display area, and a chip on film (COF) and a testing structure are disposed in the non-display area;

wherein the testing structure comprises:

a test pad disposed at a side of the COF remote from the display area; and a testing circuit positioned between the test pad and the COF and including a signal trace connecting the COF and the test pad, wherein the signal trace comprises a non-metal trace and a metal trace connected to each other, and a cutting line is disposed on the signal trace;

a step S20 of testing the display area of the substrate by the testing structure; and a step S30 of removing the test pad along the cutting line, so as to form the display panel.

In accordance with one embodiment of the present disclosure, in the step S10, the signal trace comprises the metal trace at two ends of the signal trace and the non-metal trace in middle of the signal trace, the metal trace comprises a first metal trace connecting to the COF and a second metal trace connected to the test pad, the cutting line is disposed in a region where the non-metal trace is disposed.

In accordance with one embodiment of the present disclosure, the cutting line intersects with the non-metal trace, and a distance between the cutting line and either one of two ends of the non-metal trace is greater than or equal to 100 μm.

In accordance with one embodiment of the present disclosure, the cutting line intersects with the second metal trace, and the non-metal trace has a length of 100-150 μm.

In accordance with one embodiment of the present disclosure, the substrate comprises a baseplate, a polysilicon layer, a buffer layer, and a metal layer disposed in a stacking relationship;

the non-metal trace is disposed in the polysilicon layer, the metal trace is disposed in the metal layer, the buffer layer includes a through-hole, and the non-metal trace is electrically connected to the metal trace via the through-hole to constitute the signal trace.

In accordance with one embodiment of the present disclosure, the substrate further comprises a planarization layer, the planarization layer includes a recess, the COF and the test pad are disposed in the recess.

In accordance with one embodiment of the present disclosure, the non-metal trace is made of polysilicon, and the metal trace is one of a gate wiring, a source and drain wiring, and a transparent metal wiring.

In accordance with one embodiment of the present disclosure, the step S30 comprises using a laser cutting technique to remove the test pad along the cutting line, so as to form the display panel.

In accordance with one embodiment of the present disclosure, each of m adjacent COFs constitute a COF unit, the test pads are disposed to correspond to the COF units one by one, m is an integer greater than or equal to one;

the testing circuit comprises a plurality of transistors having a same number as number of the COFs, the transistors are disposed to correspond to the COFs one by one, the transistors are electrically connected to the second metal trace;

the transistors having a same sequence number by counting the COF units from left to right and where the COFs correspond are electrically connected to each other to constitute a transistor unit, and the testing circuit controls testing of the display area by turning on and turning off the transistor unit.

In another aspect of the present disclosure, the present disclosure provides a display panel comprising a display area and a non-display area surrounding the display area;

wherein the display area comprises:

a baseplate;

a polysilicon layer disposed on the baseplate and comprising a non-metal trace;

a buffer layer disposed on the polysilicon layer and including a through-hole;

a planarization layer disposed on the buffer layer and including a recess; and a metal layer disposed on the buffer layer and comprising a metal trace, wherein the metal trace is electrically connected to the non-metal trace via the through-hole, and the metal trace is disposed in the recess;

wherein the non-display area comprises a chip on film (COF) and the non-metal trace configured to prevent the metal trace from erosion, and the COF is electrically connected to one of the non-metal trace and the metal trace.

In a still another aspect of the present disclosure, the present disclosure provides a method for manufacturing a display panel, comprising:

a step S10 of providing a substrate, wherein the substrate comprises a display area and a non-display area surrounding the display area, and a chip on film (COF) and a testing structure are disposed in the non-display area;

wherein the testing structure comprises:

a test pad disposed at a side of the COF remote from the display area, wherein the test pads are disposed to correspond to the COFs one by one; and a testing circuit positioned between the test pad and the COF and including a signal trace connecting the COF and the test pad, wherein the signal trace comprises a non-metal trace and a metal trace connected to each other, and a cutting line is disposed on the signal trace;

a step S20 of testing the display area of the substrate by the testing structure; and a step S30 of removing the test pad along the cutting line, so as to form the display panel.

In accordance with one embodiment of the present disclosure, in the step S10, the signal trace comprises the metal trace at two ends of the signal trace and the non-metal trace in middle of the signal trace, the metal trace comprises a first metal trace connecting to the COF and a second metal trace connected to the test pad, the cutting line is disposed in a region where the non-metal trace is disposed.

In accordance with one embodiment of the present disclosure, the cutting line intersects with the non-metal trace, and a distance between the cutting line and either one of two ends of the non-metal trace is greater than or equal to 100 μm.

In accordance with one embodiment of the present disclosure, the cutting line intersects with the second metal trace, and the non-metal trace has a length of 100-150 μm.

In accordance with one embodiment of the present disclosure, the substrate comprises a baseplate, a polysilicon layer, a buffer layer, and a metal layer disposed in a stacking relationship;

the non-metal trace is disposed in the polysilicon layer, the metal trace is disposed in the metal layer, the buffer layer includes a through-hole, and the non-metal trace is electrically connected to the metal trace via the through-hole to constitute the signal trace.

In accordance with one embodiment of the present disclosure, the substrate further comprises a planarization layer, the planarization layer includes a recess, the COF and the test pad are disposed in the recess.

In accordance with one embodiment of the present disclosure, the non-metal trace is made of polysilicon, and the metal trace is one of a gate wiring, a source and drain wiring, and a transparent metal wiring.

In accordance with one embodiment of the present disclosure, the step S30 comprises using a laser cutting technique to remove the test pad along the cutting line, so as to form the display panel.

In accordance with one embodiment of the present disclosure, each of m adjacent COFs constitute a COF unit, the test pads are disposed to correspond to the COF units one by one, m is an integer greater than or equal to one;

the testing circuit comprises a plurality of transistors having a same number as number of the COFs, the transistors are disposed to correspond to the COFs one by one, the transistors are electrically connected to the second metal trace;

the transistors having a same sequence number by counting the COF units from left to right and where the COFs correspond are electrically connected to each other to constitute a transistor unit, and the testing circuit controls testing of the display area by turning on and turning off the transistor unit.

The present disclosure provides advantageous effects. By disposing the signal trace to be composed of the metal trace and the non-metal trace, the test pad can be removed without resulting in erosion of the metal trace. Therefore, the structure of the display panel is simplified, and the likelihood that electrostatic charge causes damage to the display panel is reduced.

DESCRIPTION OF SPECIFIC EMBODIMENTS
OF THE INVENTION

The following embodiments refer to the accompanying drawings for exemplifying specific implementable embodiments of the present disclosure. Moreover, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, the same reference symbol represents the same or similar components.

The present disclosure provides a testing structure of a display panel in order to solve the problems encountered by the prior art, where a portion of a metal trace is exposed and is eroded after the testing structure of the display panel is cut off, affecting quality of the display panel.

With reference to the drawings and embodiments, detailed description is provided below for the present invention.

Figure 2:
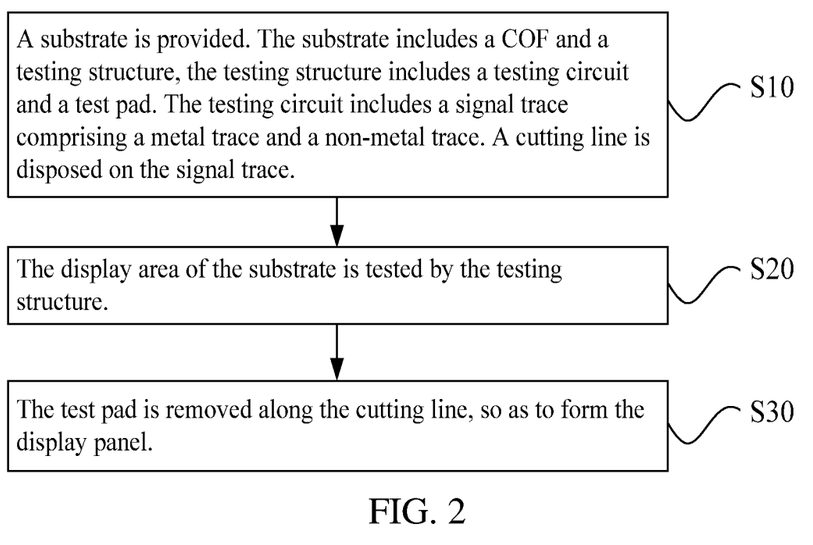
FIG. 2 shows a flowchart of a method for manufacturing a display panel according to one embodiment of the present disclosure.

Please see FIG. 2. FIG. 2 shows a flowchart of a method for manufacturing a display panel according to one embodiment of the present disclosure.

The present disclosure provides a method for manufacturing the same. The method includes the following steps.

Figure 3:
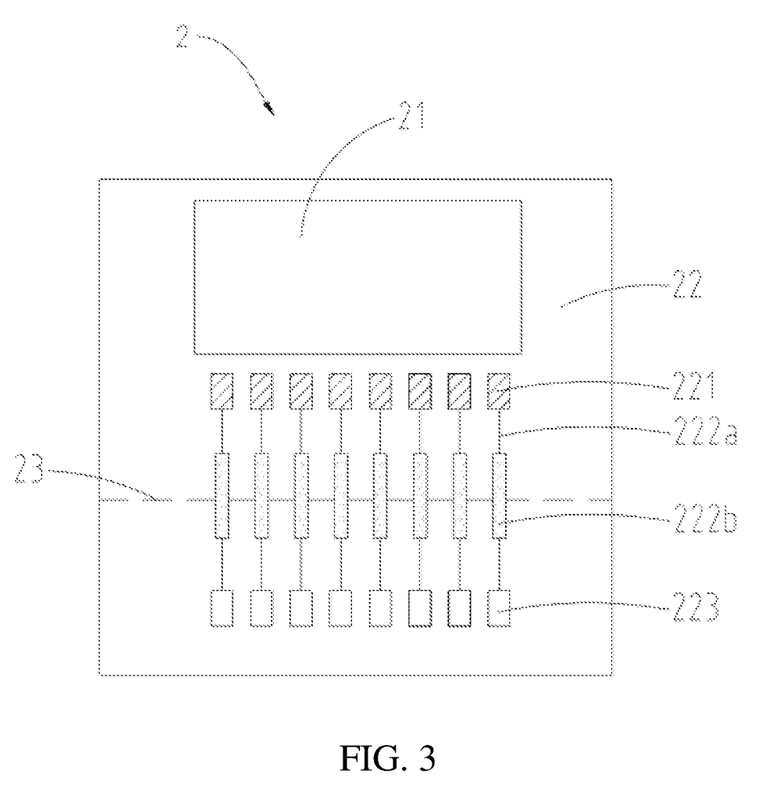
FIG. 3 is a schematic diagram showing a structure of a display panel according to one embodiment of the present disclosure before the testing structure is cut off.

Please see FIG. 3, which is a schematic diagram showing a structure of a display panel according to one embodiment of the present disclosure before the testing structure is cut off.

In step S10, a substrate 2 is provided. The substrate 2 includes a display area 21 and a non-display area 22 surrounding the display area 21. A chip on film (COF) 221 and a testing structure are disposed in the non-display area.

The COF 221 is configured to generate to a test signal.

In one embodiment, the COF 221 includes a base and a flexible printed circuit (FPC) disposed on the base. The test signal is generated in the FPC.

The testing structure includes a test pad 223 and a testing circuit 222.

The test pad 223 is configured to receive the test signal and to transmit the test signal to the display area 21.

In one embodiment, the test pad 223 is disposed at a side of the COF 221 remote from the display area 21. The test pad 223 is configured to test the display area 21. After testing of the display area 21 is accomplished, the test pad 223 can be removed, so as to simplify the structure of the display panel.

The testing circuit is positioned between the test pad 223 and the COF 221, and includes a signal trace 222 connecting the COF 221 and the test pad 223.

The signal trace 222 includes a metal trace 222a and a non-metal trace 222b connected to each other. A cutting line 23 is disposed on the signal trace 222.

In one embodiment, by arranging both the metal trace 222a and the non-metal trace 222b, a portion of the non-metal trace 222b is retained after the test pad is cut off, such that erosion of the metal trace 222a due to intrusion of water and oxygen into the panel can be prevented, enhancing quality of the display panel.

In one embodiment, the testing structure further includes a cutting line 23. After testing for the display panel by the testing structure is accomplished, the test pad 223 is cut off and removed along the cutting line 23.

In one embodiment, the non-display area of the display panel includes a retaining area and a cut-off area. A boundary between the retaining area and the cut-off area is determined by the cutting line 23. A region where the test pad 223 is disposed is the cut-off area.

In one embodiment, the cut-off technique performed on the cutting line 23 is a laser cutting technique.

In step S20, the display area 21 of the substrate is tested by the testing structure.

In step S30, the test pad 223 is removed along the cutting line 23, so as to form the display panel.

Figure 4:
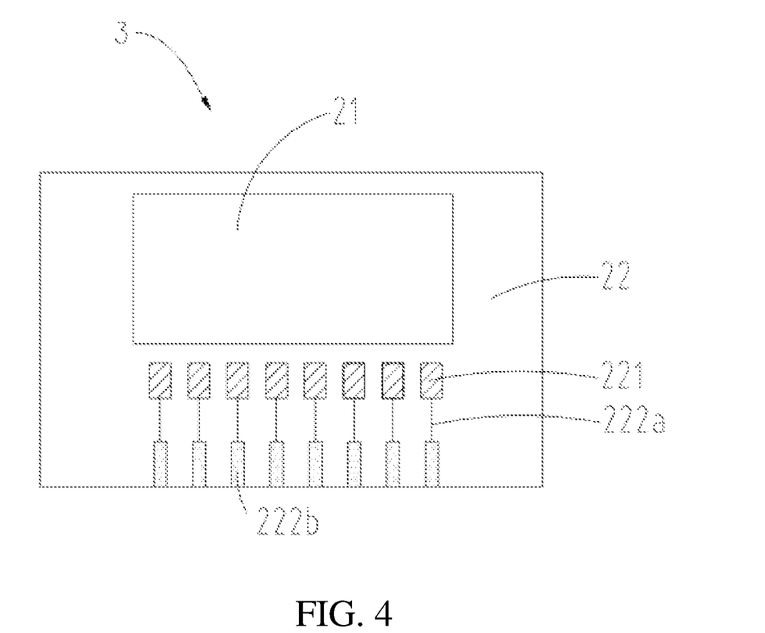
FIG. 4 is a schematic diagram showing a structure of a display panel according to one embodiment of the present disclosure.

Please refer to FIG. 4, which is a schematic diagram showing a structure of a display panel according to one embodiment of the present disclosure.

Figure 5:
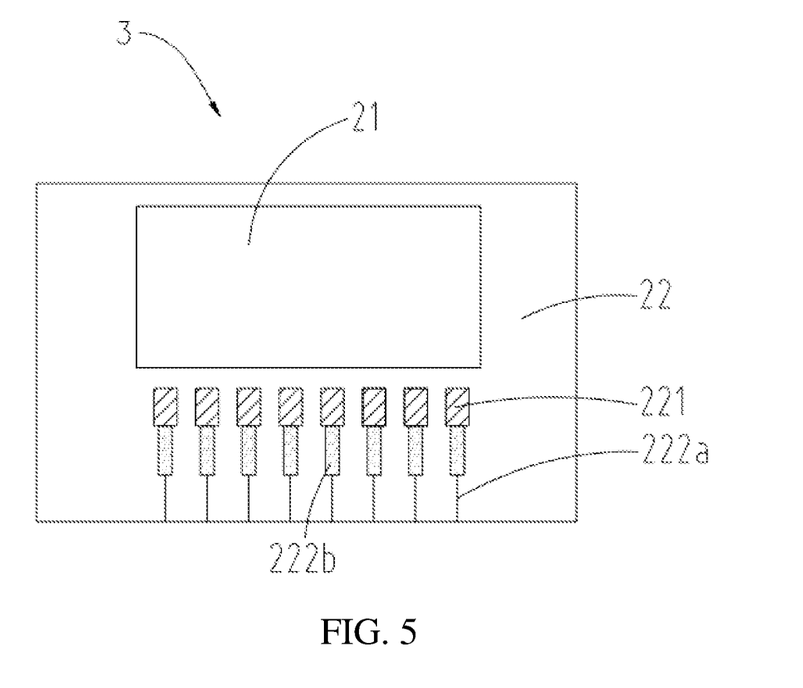
FIG. 5 is a schematic diagram showing a structure of a display panel according to another embodiment of the present disclosure.

Please refer to FIG. 5, which is a schematic diagram showing a structure of a display panel according to another embodiment of the present disclosure.

It is understood that while the display area 21 is tested, it is required to use the signal trace 222 to transmit signals. The non-metal trace 222b should not only have excellent water and oxygen blocking properties but have excellent electrical conductivity in order to reduce resistance of the non-metal trace 222b. Therefore, for design of the non-metal trace 222b, the non-metal trace 222b has to have a length as short as possible. But, in consideration of precision of cut applied along the cutting line 23, the non-metal trace 222b is designed to have a length falling within an appropriate range.

In one embodiment, the cutting line 23 intersects with the non-metal trace 222b. A distance between the cutting line 23 and either one of two ends of the non-metal trace 222b is greater than or equal to 100 μm. In other words, if the cutting line 23 intersects with the non-metal trace 222b at the middle point of the non-metal trace 222b, the non-metal trace 222b will have a minimum length of 200 μm. In this case, the cutting line 23 is disposed on the non-metal trace 222b. In another embodiment, the cutting line 23 is disposed on the second metal trace. Such a design shortens length of the non-metal trace 222b, and thus reduce resistance of the signal trace 222 at the time testing of the display area 21 is performed.

Figure 6:
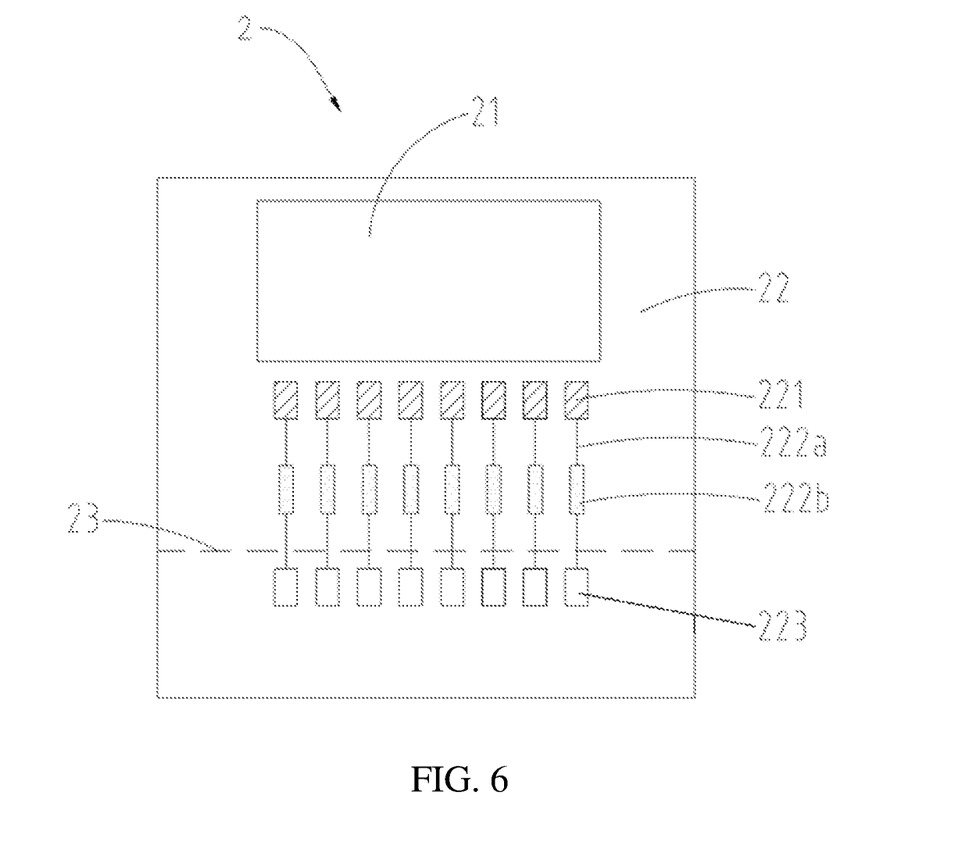
FIG. 6 is a schematic diagram showing a structure of a display panel according to another embodiment of the present disclosure before the testing structure is cut off.

Please refer to FIG. 6, which is a schematic diagram showing a structure of a display panel according to another embodiment of the present disclosure before the test pad of the testing structure is cut off.

In one embodiment, the cutting line 23 intersects with the second metal trace. The non-metal trace 222b has a length of 100-150 μm.

Figure 7:
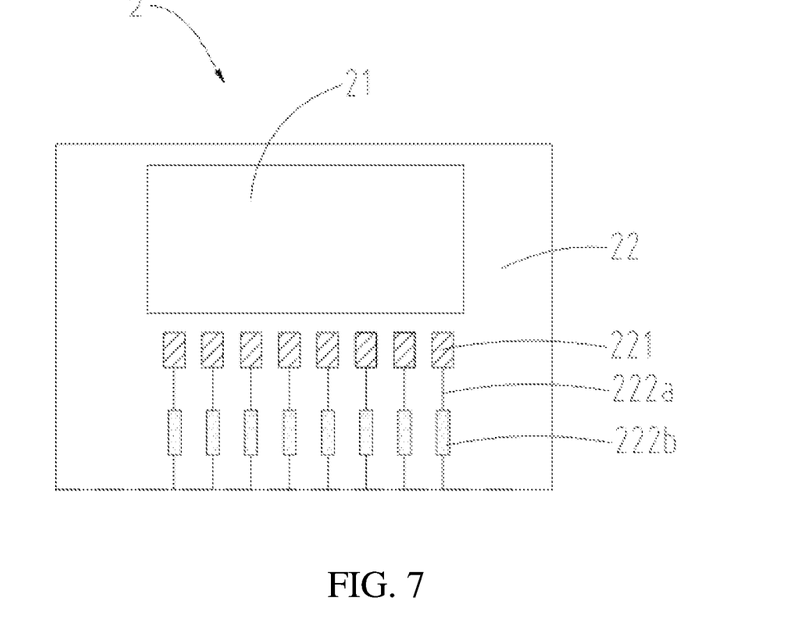
FIG. 7 is a schematic diagram showing a structure of a display panel according to another embodiment of the present disclosure.

Please refer to FIG. 7, which is a schematic diagram showing a structure of a display panel according to another embodiment of the present disclosure after the test pad of the testing structure is cut off.

In one embodiment, the substrate includes a baseplate, a polysilicon layer, a buffer layer, and a metal layer disposed in a stacking relationship.

In one embodiment, the non-metal trace 222b is disposed in the polysilicon layer, the metal trace 222a is disposed in the metal layer, the buffer layer includes a through-hole, and the non-metal trace 222b is electrically connected to the metal trace 222a via the through-hole to constitute the signal trace 222.

According to the present disclosure, a same mask is used to simultaneously form the polysilicon layer and the non-metal trace 222b, a same mask is used to simultaneously form the metal layer and the metal trace 222a, and a same mask is used to simultaneously form the buffer layer and the through-hole. Therefore, additional processes are not needed in order to form the signal trace, and the manufacturing cost of the testing structure is remarkably reduced. The present invention is not limited to the design that a through-hole is formed in the buffer layer in order to connect the metal trace 222a and the non-metal trace 222b. If there are any film structures sandwiched between the metal layer and the polysilicon layer, the through-hole is formed to pass through such film structures to make connection between the metal trace 222a and the non-metal trace 222b In one embodiment, the substrate further includes a planarization layer. The planarization layer includes a recess. The COF 221 and the test pad 223 are disposed in the recess. Thus, during manufacturing the display panel, this prevents the problem, where the COF 221 and the test pad 223 protrude and thus are not securely disposed, from occurring.

In one embodiment, the non-metal trace 222b is made of polysilicon. The metal trace 222a is one of a gate wiring, a source and drain wiring, and a transparent metal wiring. Certainly, the metal trace of the present disclosure is not limited thereto. The metal trace 222a can be formed at the same time as formation of any one of a metal layer formed in the display panel.

In one embodiment, to increase electrical conductivity of the non-metal trace 222b, the polysilicon layer is doped with at least one of boron and phosphorous.

In one embodiment, the test pads 223 and the COFs 221 are disposed to correspond to each other one by one. However, according to the present disclosure, the position relationship between the COFs 221 and the test pads 223 are not limited to such a one-by-one relationship. In other cases, a single one test pad 223 can be disposed to correspond to a plurality of COFs 221.

Figure 8:
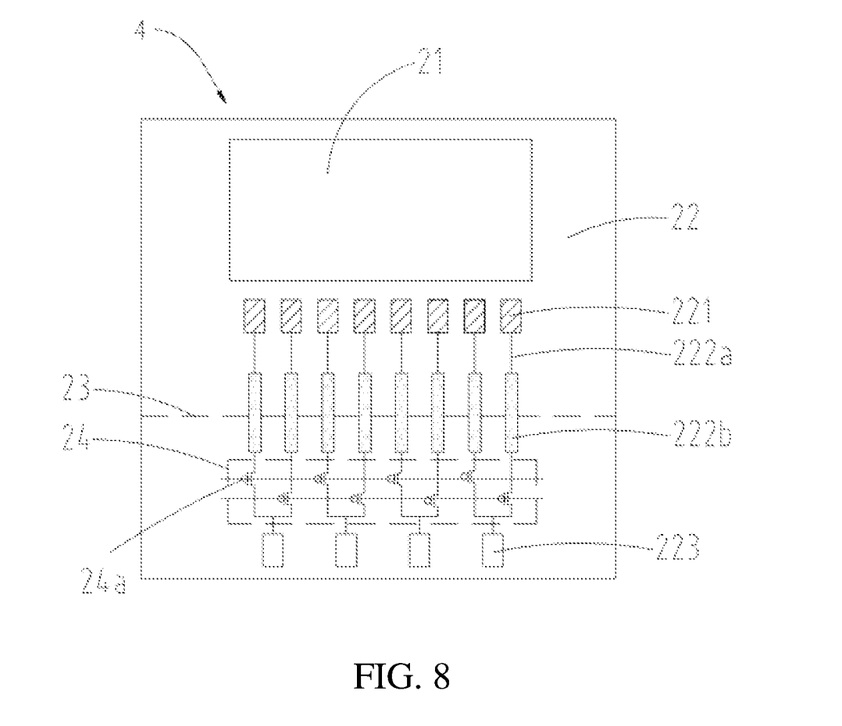
FIG. 8 is a schematic diagram showing a structure of a display panel according to still another embodiment of the present disclosure before the testing structure is cut off.

Please refer to FIG. 8, which shows a structure of a display panel according to still another embodiment of the present disclosure before the testing structure is cut off.

Figure 9:
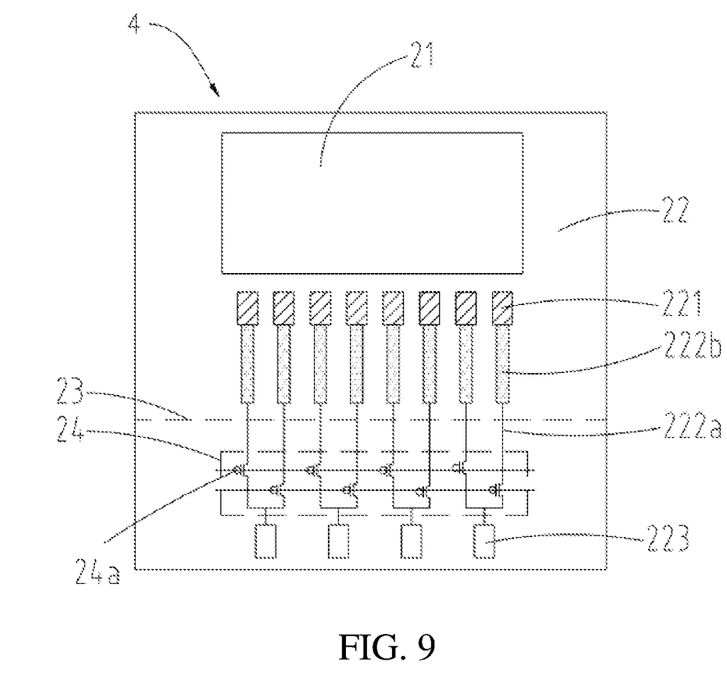
FIG. 9 is a schematic diagram showing a structure of a display panel according to still another embodiment of the present disclosure before the testing structure is cut off.

Please refer to FIG. 9, which shows a structure of a display panel according to still another embodiment of the present disclosure before the testing structure is cut off.

In one embodiment, each of m adjacent COFs 221 constitutes a COF unit. The test pads 223 are disposed to correspond to the COF units one by one. The number "m" is an integer greater than or equal to one.

The testing circuit includes a plurality of transistors 24a having a same number as the COFs 221. The transistors 24a are disposed to correspond to the COFs 221 one by one. The transistors 24a are electrically connected to the second metal trace.

The transistors having a same sequence number by counting the COF units from left to right and where the COFs correspond are electrically connected to each other to constitute a transistor unit. The testing circuit controls testing of the display area 21 by turning on and turning off the transistor unit. With use of transistors, a single one test pad 223 is connected to a plurality of COFs 221, therefore the manufacturing process of the testing structure of the display panel is simplified.

In one embodiment, testing for the display area includes array testing.

According to the present disclosure, because the test pad and a part of the testing circuit are removed after completion of testing the display area 21, and there is no need to encapsulate this portion, testing of the display area can be performed at the end of manufacturing process of the display panel.

In one embodiment, because the length of the non-metal trace can be controlled, resistance of the testing circuit connecting to the COF can be reduced. In addition, the exposed wiring after the cut-off process is carried out includes the non-metal trace, therefore erosion of the signal trace by water and oxygen is mitigated, increasing the manufacturing yield of the display panels.

Figure 10:
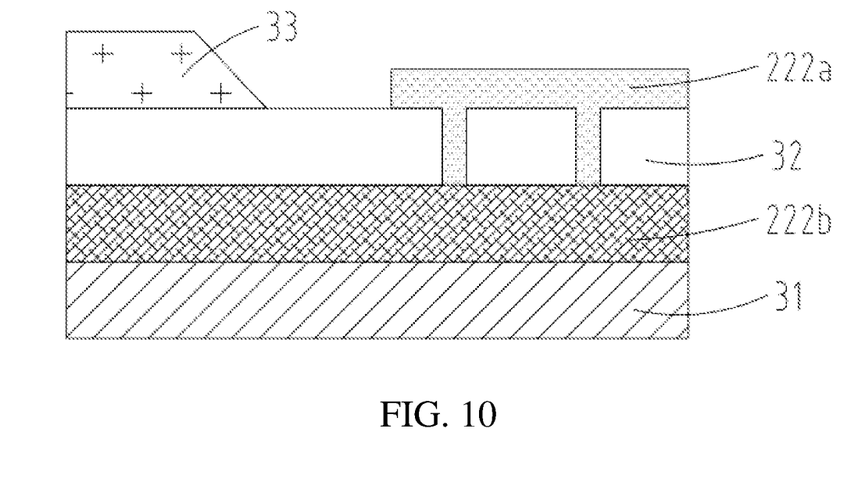
FIG. 10 shows a cross-sectional view of a display panel according to the present disclosure.

In another aspect of the present disclosure, please see FIGS. 4, 5, and 10. The present disclosure further provides a display panel. The display panel includes a display area 21 and a non-display area 22 surrounding the display area.

The display area 21 includes:
a baseplate 31;
a polysilicon layer disposed on the baseplate and including a non-metal trace 222b;
a buffer layer 32 disposed on the polysilicon layer and including a through-hole;
a planarization layer 33 disposed on the buffer layer and including a recess; and
a metal layer disposed on the buffer layer 32 and including a metal trace 222a, wherein the metal trace 222a is electrically connected to the non-metal trace 222b via the through-hole, and the metal trace 222a is disposed in the recess.

The non-display area 22 includes a chip on film (COF) 221 and the non-metal trace 222b configured to prevent the metal trace 222a from erosion. The COF 221 is electrically connected to one of the non-metal trace 222b and the metal trace 222a.

Detailed description for the display panel is generally similar to detailed description for the method for manufacturing the display panel, as described above. Therefore, please refer to above detailed description for the method for manufacturing the display panel, so as to realize technical content of the display panel. Detailed description for the display panel is omitted.

The present disclosure provides advantageous effects. By disposing the signal trace to be composed of the metal trace and the non-metal trace, the test pad can be removed without resulting in erosion of the metal trace. Therefore, the structure of the display panel is simplified, and the likelihood that electrostatic charge causes damage to the display panel is reduced.

While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A method for manufacturing a display panel, comprising:
   a step S10 of providing a substrate, wherein the substrate comprises a display area and a non-display area surrounding the display area, and a chip on film (COF) and a testing structure are disposed in the non-display area;
   wherein the testing structure comprises:
   a test pad disposed at a side of the COF remote from the display area; and
   a testing circuit positioned between the test pad and the COF and including a signal trace connecting the COF and the test pad, wherein the signal trace comprises a non-metal trace and a metal trace connected to each other, and a cutting line is disposed on the signal trace;
   a step S20 of testing the display area of the substrate by the testing structure; and
   a step S30 of removing the test pad along the cutting line, so as to form the display panel.

2. The method for manufacturing the display panel according to claim 1, wherein in the step S10, the signal trace comprises the metal trace at two ends of the signal trace and the non-metal trace in middle of the signal trace, the metal trace comprises a first metal trace connected to the COF and a second metal trace connected to the test pad, the cutting line is disposed in a region where the non-metal trace is disposed.

3. The method for manufacturing the display panel according to claim 2, wherein the cutting line intersects the non-metal trace, and a distance between the cutting line and either one of two ends of the non-metal trace is greater than or equal to 100 μm.

4. The method for manufacturing the display panel according to claim 2, wherein the cutting line intersects the second metal trace, and the non-metal trace has a length of 100-150 μm.

5. The method for manufacturing the display panel according to claim 2, wherein
each of m adjacent COFs constitute a COF unit, the test pads are disposed to correspond to the COF units one by one, m is an integer greater than or equal to one;
the testing circuit comprises a plurality of transistors having a same number as number of the COFs, the transistors are disposed to correspond to the COFs one by one, the transistors are electrically connected to the second metal trace;
the transistors having a same sequence number by counting the COF units from left to right and where the COFs correspond are electrically connected to each other to constitute a transistor unit, and the testing circuit controls testing of the display area by turning on and turning off the transistor unit.

6. The method for manufacturing the display panel according to claim 1, wherein
the substrate comprises a baseplate, a polysilicon layer, a buffer layer, and a metal layer disposed in a stacking relationship;
the non-metal trace is disposed in the polysilicon layer, the metal trace is disposed in the metal layer, the buffer layer includes a through-hole, and the non-metal trace is electrically connected to the metal trace via the through-hole to constitute the signal trace.

7. The method for manufacturing the display panel according to claim 6, wherein the substrate further comprises a planarization layer, the planarization layer includes a recess, the COF and the test pad are disposed in the recess.

8. The method for manufacturing the display panel according to claim 1, wherein the non-metal trace is made of polysilicon, and the metal trace is one of a gate wiring, a source and drain wiring, and a transparent metal wiring.

9. The method for manufacturing the display panel according to claim 1, wherein the step S30 comprises using a laser cutting technique to remove the test pad along the cutting line, so as to form the display panel.

10. A display panel comprising a display area and a non-display area surrounding the display area;
wherein the display area comprises:
a baseplate;
a polysilicon layer disposed on the baseplate and comprising a non-metal trace;
a buffer layer disposed on the polysilicon layer and including a through-hole;
a planarization layer disposed on the buffer layer and including a recess; and
a metal layer disposed on the buffer layer and comprising a metal trace, wherein the metal trace is electrically connected to the non-metal trace via the through-hole, and the metal trace is disposed in the recess;
wherein the non-display area comprises a chip on film (COF) and the non-metal trace configured to prevent the metal trace from erosion, and the COF is electrically connected to one of the non-metal trace and the metal trace.

11. A method for manufacturing a display panel, comprising:
a step S10 of providing a substrate, wherein the substrate comprises a display area and a non-display area surrounding the display area, and a chip on film (COF) and a testing structure are disposed in the non-display area; wherein the testing structure comprises:
a test pad disposed at a side of the COF remote from the display area, wherein the test pads are disposed to correspond to the COFs one by one; and
a testing circuit positioned between the test pad and the COF and including a signal trace connecting the COF and the test pad, wherein the signal trace comprises a non-metal trace and a metal trace connected to each other, and a cutting line is disposed on the signal trace;
a step S20 of testing the display area of the substrate by the testing structure; and
a step S30 of removing the test pad along the cutting line, so as to form the display panel.

12. The method for manufacturing the display panel according to claim 11, wherein in the step S10, the signal trace comprises the metal trace at two ends of the signal trace and the non-metal trace in middle of the signal trace, the metal trace comprises a first metal trace connected to the COF and a second metal trace connected to the test pad, the cutting line is disposed in a region where the non-metal trace is disposed.

13. The method for manufacturing the display panel according to claim 12, wherein the cutting line intersects the non-metal trace, and a distance between the cutting line and either one of two ends of the non-metal trace is greater than or equal to 100 μm.

14. The method for manufacturing the display panel according to claim 12, wherein the cutting line intersects the second metal trace, and the non-metal trace has a length of 100-150 μm.

15. The method for manufacturing the display panel according to claim 12, wherein
each of m adjacent COFs constitute a COF unit, the test pads are disposed to correspond to the COF units one by one, m is an integer greater than or equal to one;
the testing circuit comprises a plurality of transistors having a same number as number of the COFs, the transistors are disposed to correspond to the COFs one by one, the transistors are electrically connected to the second metal trace;
the transistors having a same sequence number by counting the COF units from left to right and where the COFs correspond are electrically connected to each other to constitute a transistor unit, and the testing circuit controls testing of the display area by turning on and turning off the transistor unit.

16. The method for manufacturing the display panel according to claim 11, wherein
the substrate comprises a baseplate, a polysilicon layer, a buffer layer, and a metal layer disposed in a stacking relationship;
the non-metal trace is disposed in the polysilicon layer, the metal trace is disposed in the metal layer, the buffer layer includes a through-hole, and the non-metal trace is electrically connected to the metal trace via the through-hole to constitute the signal trace.

17. The method for manufacturing the display panel according to claim 16, wherein the substrate further comprises a planarization layer, the planarization layer includes a recess, the COF and the test pad are disposed in the recess.

18. The method for manufacturing the display panel according to claim 11, wherein the non-metal trace is made of polysilicon, and the metal trace is one of a gate wiring, a source and drain wiring, and a transparent metal wiring.

19. The method for manufacturing the display panel according to claim 11, wherein the step S30 comprises using a laser cutting technique to remove the test pad along the cutting line, so as to form the display panel.

* * * * *